(12) United States Patent
Uejima

(10) Patent No.: US 8,189,613 B2
(45) Date of Patent: May 29, 2012

(54) HIGH-FREQUENCY COMPONENT

(75) Inventor: Takanori Uejima, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 605 days.

(21) Appl. No.: 12/251,531

(22) Filed: Oct. 15, 2008

(65) Prior Publication Data

US 2009/0034504 A1 Feb. 5, 2009

Related U.S. Application Data

(63) Continuation of application No. PCT/JP2008/050603, filed on Jan. 18, 2008.

(30) Foreign Application Priority Data

Jan. 19, 2007 (JP) ................................ 2007-010755

(51) Int. Cl.
*H04L 12/66* (2006.01)

(52) U.S. Cl. ..................................................... 370/463

(58) Field of Classification Search ........................ None
See application file for complete search history.

(56) References Cited

U.S. PATENT DOCUMENTS

| | | | |
|---|---|---|---|
| 7,324,493 B2* | 1/2008 | Yamada et al. ............... 370/342 |
| 7,653,360 B2* | 1/2010 | Uejima et al. .................. 455/78 |
| 2002/0032038 A1 | 3/2002 | Furutani et al. | |
| 2003/0092397 A1 | 5/2003 | Uriu et al. | |
| 2004/0116098 A1 | 6/2004 | Ochii et al. | |
| 2004/0248539 A1 | 12/2004 | Furutani et al. | |
| 2006/0141944 A1* | 6/2006 | Shibagaki et al. ............... 455/78 |
| 2007/0030095 A1* | 2/2007 | Hikita et al. ................... 333/133 |
| 2007/0035362 A1* | 2/2007 | Uejima et al. ................. 333/133 |
| 2008/0258839 A1* | 10/2008 | Uejima et al. ................. 333/101 |

FOREIGN PATENT DOCUMENTS

| | | |
|---|---|---|
| CN | 1336731 A | 2/2002 |
| EP | 1 303 055 A1 | 4/2003 |
| EP | 1 311 063 A2 | 5/2003 |
| JP | 2002-094410 A | 3/2002 |
| JP | 2004-094410 A | 3/2004 |
| JP | 2006-148975 A | 6/2006 |
| WO | 2006/059294 A1 | 6/2006 |

OTHER PUBLICATIONS

Official Communication issued in corresponding European Patent Application No. 08703453.4, mailed on Mar. 3, 2011.
Official Communication issued in International Patent Application No. PCT/JP2008/050603, mailed on Apr. 1, 2008.
Official Communication issued in corresponding Taiwanese Patent Application No. 96151372, mailed on Feb. 13, 2012.

* cited by examiner

Primary Examiner — Anh-Vu Ly
(74) Attorney, Agent, or Firm — Keating & Bennett, LLP

(57) ABSTRACT

A high-frequency component includes a diplexer in which a high-pass filter and a low-pass filter are connected in parallel with an antenna port, a high-frequency circuit cascade-connected to the high-pass filter, and a low-frequency circuit cascade-connected to the low-pass filter. A filter which causes an impedance mismatch to occur is connected to the low-frequency circuit. The low-pass filter includes a line. The low-pass filter is defined by a parallel resonant circuit including the line and a series circuit including the line. A resonant frequency of the parallel resonant circuit is a trap frequency of a high-frequency transmission/reception signal. A resonant frequency of all elements of the low-pass filter is a trap frequency of undesired resonance that occurs at high frequencies.

6 Claims, 11 Drawing Sheets

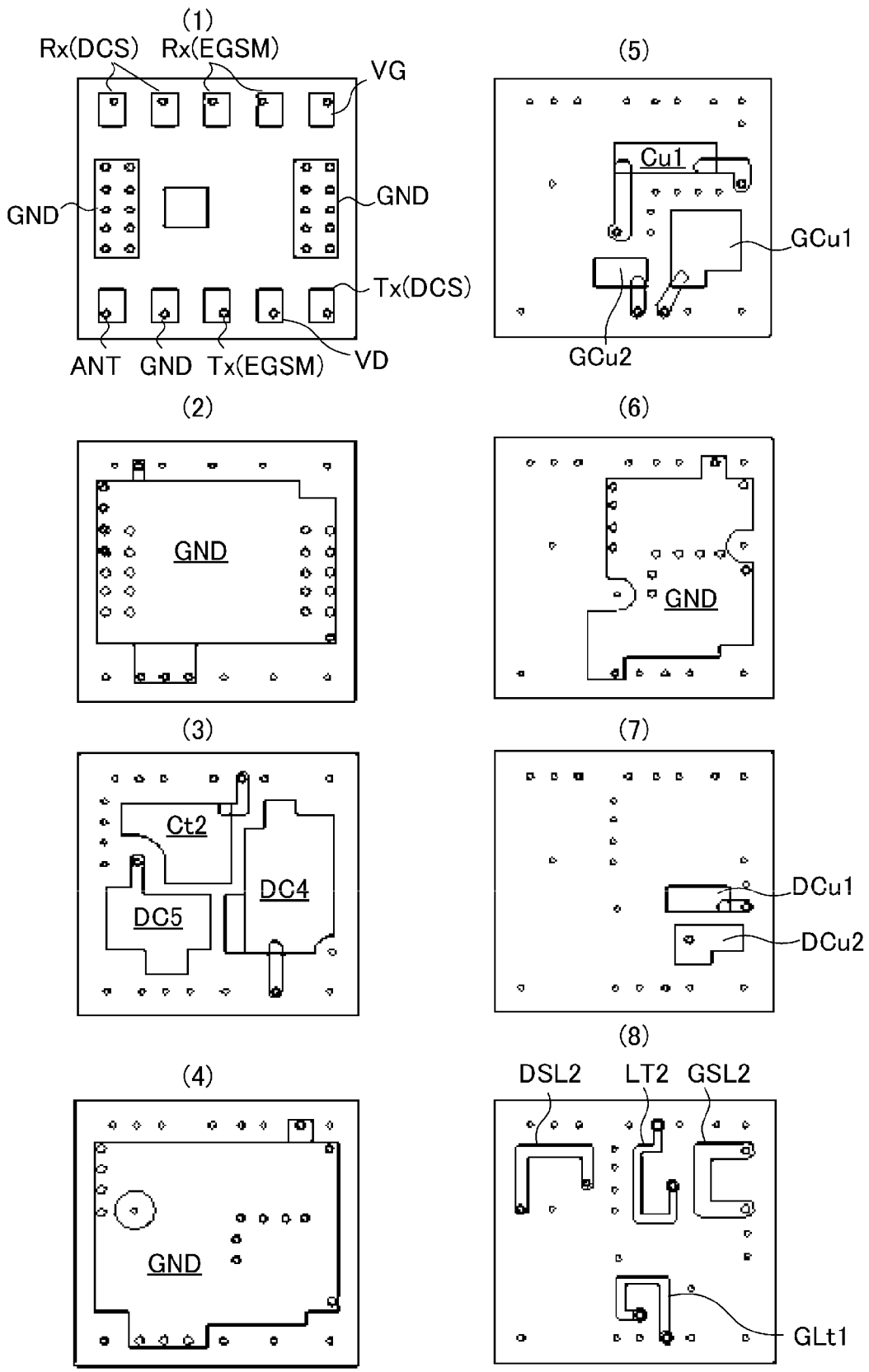

FIG. 7
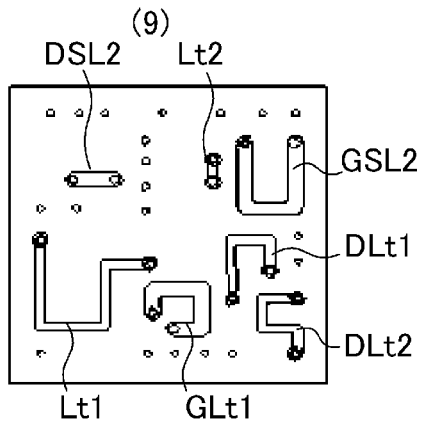
(9)
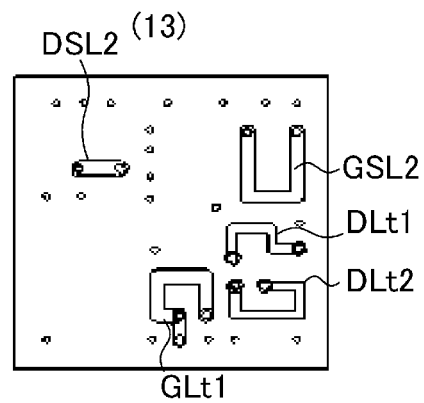
(13)
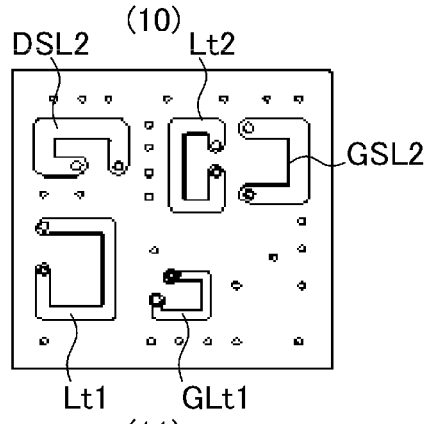
(10)
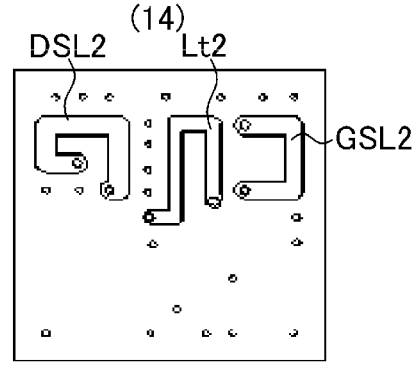
(14)
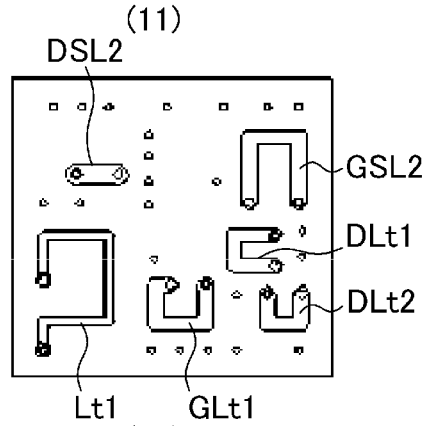
(11)
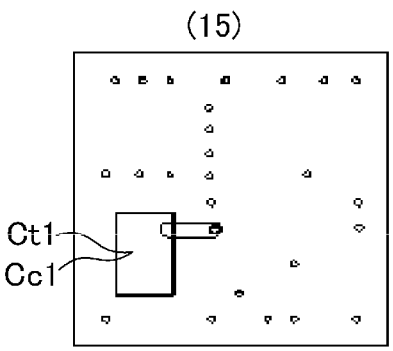
(15)
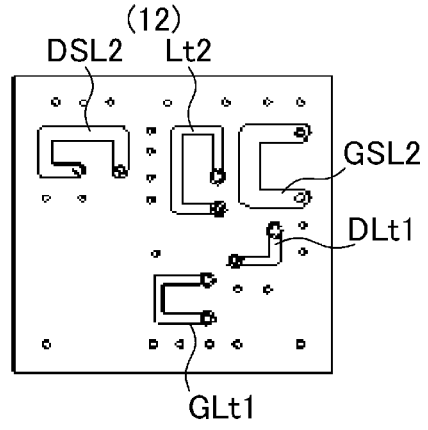
(12)
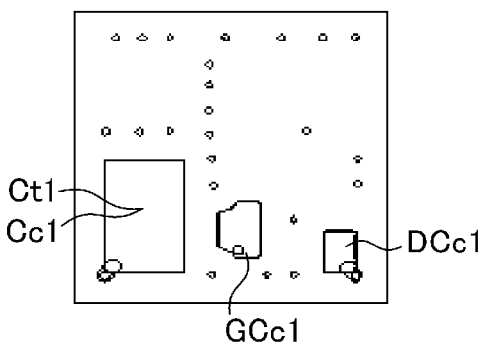
(16)

FIG. 8
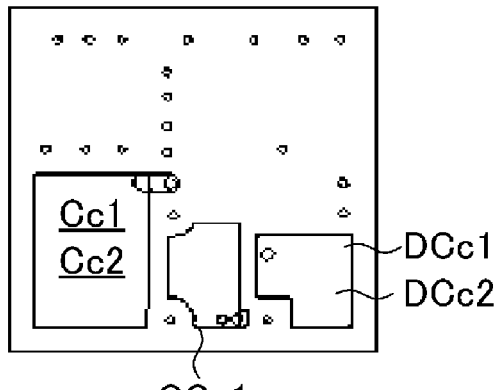
(18)
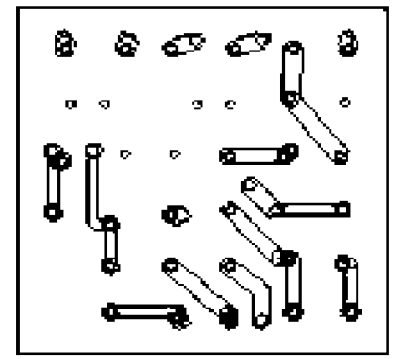
(21)
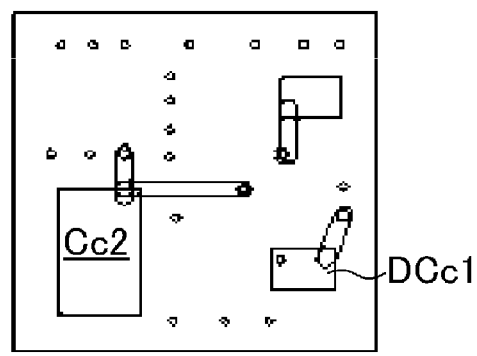
(19)
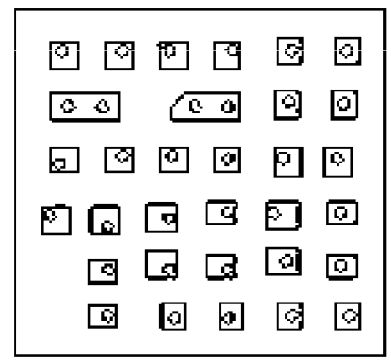
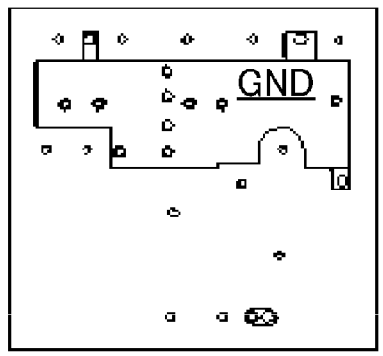

HIGH-FREQUENCY COMPONENT

BACKGROUND OF THE INVENTION

1. Field of the Invention

The present invention relates to a high-frequency component that can be used in a plurality of different mobile communication systems.

2. Description of the Related Art

A mobile communication apparatus that can operate in a plurality of communication systems using different frequency bands has been provided. Examples of the communication systems include GSM 1800 (DCS 1800) using a 1800 MHz band, GSM 1900 (PCS 1900) using a 1900 MHz band, GSM 850 using a 850 MHz band, and GSM 900 (EGSM 900) using a 900 MHz band.

Such a mobile communication apparatus includes a front end unit that performs demultiplexing and multiplexing of transmission/reception signals and has multiband functionality, such as quad-band functionality to support four communication systems, triple-band functionality to support three communication systems, or dual-band functionality to support two communication systems (see, e.g., Japanese Unexamined Patent Application Publication No. 2002-94410).

Typically, a front end unit of such a multiband mobile communication apparatus is defined by a module, and includes a diplexer connected to an antenna port and a plurality of switching circuits connected downstream of the diplexer.

For example, in a front end unit of a dual-band mobile communication apparatus, a diplexer performs demultiplexing and multiplexing of low-frequency transmission/reception signals (e.g., EGSM (GSM 900 or GSM 850) transmission/reception signals) and high-frequency transmission/reception signals (e.g., DCS or PCS transmission/reception signals). Then, in a low-frequency circuit downstream of the diplexer, an EGSM switching circuit performs switching between EGSM transmission and reception signals. Likewise, in a high-frequency circuit downstream of the diplexer, a switching circuit performs switching between DCS (PCS) transmission and reception signals.

In a front end unit of a triple-band or quad-band mobile communication apparatus, for example, additional switching circuits are provided downstream of the switching circuits described above, so that switching between GSM 850 and GSM 900 reception signals and switching between DCS and PCS reception signals are performed.

In the front end units described above, a reception path for each communication system may be provided with an unbalanced-input/balanced-output SAW filter that passes only a reception signal band to eliminate unwanted frequency signals and amplifies a reception signal. The SAW filter prevents signals from propagating from a transmission path to the reception path, and thus prevents problems in a circuit in the reception path.

In a typical circuit configuration of the diplexer, a high-frequency filter and a low-frequency filter are connected in parallel with an antenna port.

The high-frequency filter may be defined by a plurality of capacitors cascade-connected to the antenna port and a series resonant circuit having one end connected between the capacitors and the other end grounded. An impedance of each of these elements of the high-frequency filter is set such that a low-frequency transmission/reception signal is attenuated and a high-frequency transmission/reception signal is allowed to pass through.

To steepen a cutoff characteristic curve at an attenuation pole that prevents the low-frequency transmission/reception signal from reaching high frequencies, an impedance of each element of the series resonant circuit in the high-frequency filter is set such that the frequency of the attenuation pole is substantially equal to a trap frequency of the low-frequency transmission/reception signal (e.g., a resonant frequency substantially equal to a standard center frequency in the low-frequency communication system).

On the other hand, the low-frequency filter includes a parallel resonant circuit defined by a line connected to the antenna port and a capacitor connected in parallel with the line. An impedance of each of elements of the low-frequency filter is set such that a high-frequency transmission/reception signal is attenuated and a low-frequency transmission/reception signal is allowed to pass through.

To steepen a transmission characteristic curve at an attenuation pole that prevents the high-frequency transmission/reception signal from reaching low frequencies, an impedance of each element of the parallel resonant circuit in the low-frequency filter is set such that the frequency of the attenuation pole is substantially equal to a trap frequency of the high-frequency transmission/reception signal (e.g., a resonant frequency substantially equal to a standard center frequency in the communication system).

When a SAW filter is provided in a reception path in each communication system, since the impedance of the SAW filter is less than 50Ω at frequencies outside its passband, impedance match cannot be achieved in a connecting portion of the SAW filter. Thus, to achieve impedance matching, it is necessary to provide a phase adjusting circuit in the front end unit and to provide a multistage filter in the diplexer. This is disadvantageous because the circuit configuration becomes complex, the number of parts increases, and the size of the module increases.

If a SAW filter is provided in a reception path for a high-frequency or low-frequency communication system without performing impedance matching, transmission characteristics in a frequency band of one communication system and cutoff characteristics in a frequency band of the other communication system will be deteriorated.

SUMMARY OF THE INVENTION

The inventor of the present application focused on the fact that the occurrence of an impedance mismatch in the low-frequency circuit caused resonance of all the elements of the low-frequency filter (low-pass filter) to occur, which affected cutoff characteristics at high frequencies, and caused an undesired attenuation pole to occur in the cutoff characteristics at high frequencies. Thus, the inventor of the present invention focused on an impedance mismatch when a SAW filter is provided in a low-frequency circuit.

To overcome the problems described above, preferred embodiments of the present invention provide a high-frequency component which has a simple configuration and in which transmission characteristics at low frequencies and cutoff characteristics at high frequencies are not deteriorated, even when there is an impedance mismatch.

A high-frequency component according to a preferred embodiment of the present invention includes a diplexer, a high-frequency circuit, and a low-frequency circuit.

Preferably, the diplexer is defined by connecting a high-frequency filter and a low-frequency filter in parallel with an antenna port. The low-frequency filter allows a low-frequency transmission/reception signal to pass and attenuates a high-frequency transmission/reception signal. The high-frequency filter allows the high-frequency transmission/reception signal pass and attenuates the low-frequency transmission/reception signal. The high-frequency circuit is cascade-connected to the high-pass filter in the diplexer, while the low-frequency circuit is cascade-connected to the low-pass filter in the diplexer. The low-frequency filter includes an inductor connected between the antenna port and the low-frequency circuit and is defined by a parallel circuit including the inductor and a first capacitor and a series circuit including the inductor and a second capacitor.

Preferably, transmission characteristics of frequency characteristics at low frequencies are set by the series circuit and the parallel circuit. Then, a resonant frequency of all of the elements of the low-frequency filter is set to be substantially equal to a frequency of a predetermined attenuation pole in frequency characteristics of the high-frequency filter.

With this configuration, by adjusting and setting a resonant frequency of all of the elements of the low-frequency filter, a frequency of an undesired attenuation pole which occurs due to the effect of all of the elements of the low-frequency filter is substantially equal to a frequency of a predetermined attenuation pole in the frequency characteristics of the high-frequency filter. This prevents an undesired attenuation pole from occurring in the transmission characteristics at high frequencies. Therefore, with a typical configuration, such as a configuration which does not include a phase adjusting circuit and a multistage high-pass filter, even when there is an impedance mismatch in the low-frequency circuit, it is possible to achieve desired transmission characteristics at high frequencies.

The frequency of the predetermined attenuation pole may preferably be a trap frequency of a low-frequency transmission/reception signal in the transmission characteristics at high frequencies.

The low-frequency circuit may preferably include a mismatching element which causes an impedance mismatch to occur. The mismatching element may preferably be a filter. If the mismatching element is a filter, the resonant frequency of undesired resonance is preferably set outside the passband of the filter.

The low-frequency circuit may preferably include a switching circuit configured to direct the low-frequency transmission/reception signal to a transmission signal port or a reception signal port, and a SAW filter connected to the reception signal port of the switching circuit. Alternatively, the low-frequency circuit may include a first switching circuit configured to direct the low-frequency transmission/reception signal to a transmission signal port or a reception signal port; a second switching circuit connected to the reception signal port of the first switching circuit and configured to divide a low-frequency reception signal into reception signals in two frequency bands; and SAW filters connected downstream of the second switching circuit.

Thus, preferred embodiments of the present invention provide a high-frequency component with multiband functionality.

With preferred embodiments of the present invention, even when there is an impedance mismatch in a reception path for a low-frequency band, it is possible to prevent an undesired attenuation pole from occurring due to cutoff characteristics at high frequencies.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 6 illustrates each layer of the high-frequency component of a preferred embodiment of the present invention.

FIG. 7 also illustrates each layer of the high-frequency component of a preferred embodiment of the present invention.

FIG. 8 also illustrates each layer of the high-frequency component of a preferred embodiment of the present invention.

DETAILED DESCRIPTION OF THE DRAWINGS

Figure 1:
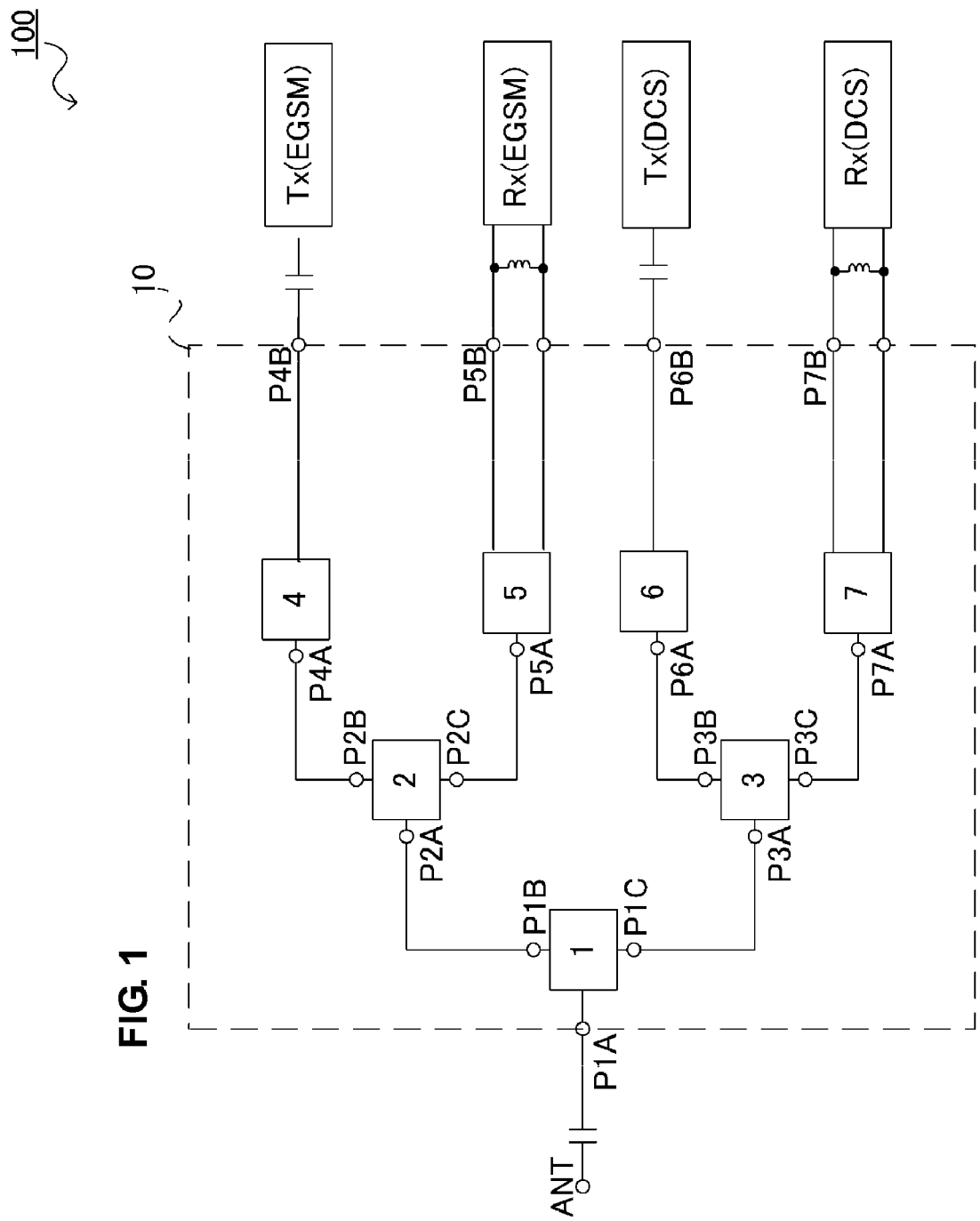
FIG. 1 is a block diagram of a dual-band high-frequency component according to a preferred embodiment of the present invention.
Figure 2:
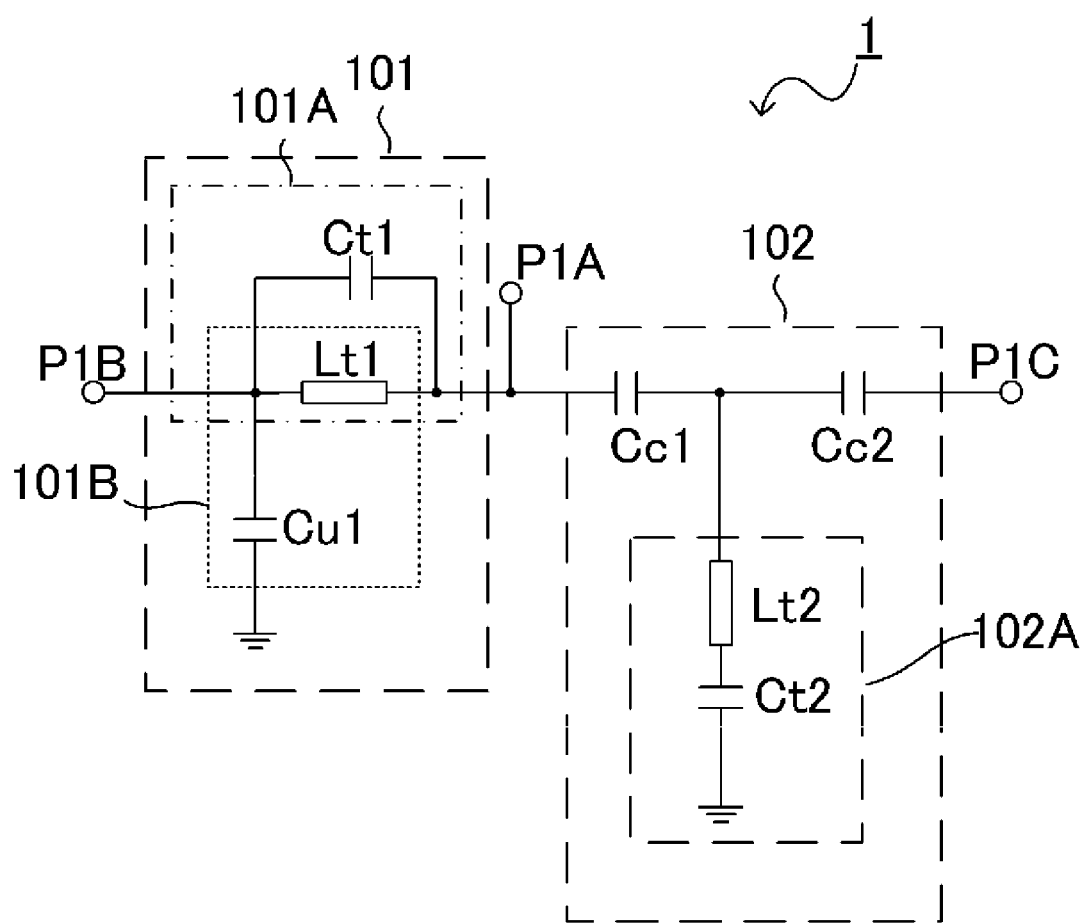
FIG. 2 is a circuit diagram illustrating a diplexer of a preferred embodiment of the present invention.

A first preferred embodiment of the present invention will be described as a high-frequency component defining a front end unit of a dual-band mobile communication apparatus that operates in the 900-MHz EGSM band and the 1.8-GHz DCS band, for example. FIG. 1 is a block diagram of the high-frequency component according to the first preferred embodiment. FIG. 2 is a circuit diagram of a diplexer included in the high-frequency component according to the first preferred embodiment.

A high-frequency component 10 is a module defined by arranging a plurality of elements together in a multilayer board.

The high-frequency component 10 includes a diplexer 1, a switching circuit 2, a switching circuit 3, an LC filter 4, a SAW filter 5, an LC filter 6, and a SAW filter 7.

A first port P1A of the diplexer 1, a second port P4B of the LC filter 4, second ports P5B of the SAW filter 5, a second port P6B of the LC filter 6, and second ports P7B of the SAW filter 7 define external connection terminals.

The first port P1A of the diplexer 1 is an antenna port connected to an antenna ANT via a matching capacitor. The second port P4B of the LC filter 4 is connected to a transmission circuit Tx (EGSM) for a low-frequency band via a matching capacitor. The second ports P5B (balanced terminals) of the SAW filter 5 are connected to a reception circuit Rx (EGSM) for the low-frequency band, with a matching reactance element interposed between the balanced terminals. The second port P6B of the LC filter 6 is connected to a transmission circuit Tx (DCS) for a high-frequency band via a matching capacitor. The second ports P7B (balanced terminals) of the SAW filter 7 are connected to a reception circuit Rx (DCS) for the high-frequency band, with a matching reactance element interposed between the balanced terminals.

In the high-frequency component 10, the switching circuit 2, the LC filter 4, and the SAW filter 5 define a low-frequency circuit which defines a front end for the low-frequency band (EGSM). In addition, in the high-frequency component 10, the switching circuit 3, the LC filter 6, and the SAW filter 7 define a high-frequency circuit which defines a front end for the high-frequency band (DCS).

A first port P2A of the switching circuit 2 is connected to a second port P1B of the diplexer 1, while a first port P3A of the switching circuit 3 is connected to a third port P1C of the diplexer 1. A first port P4A of the LC filter 4 is connected to a second port P2B of the switching circuit 2, while a first port P5A of the SAW filter 5 is connected to a third port P2C of the switching circuit 2. A first port P6A of the LC filter 6 is connected to a second port P3B of the switching circuit 3, while a first port P7A of the SAW filter 7 is connected to a third port P3C of the switching circuit 3.

The diplexer 1 separates a DCS transmission/reception signal and an EGSM transmission/reception signal from an antenna signal. The switching circuit 2 separates an EGSM transmission signal and an EGSM reception signal from the EGSM transmission/reception signal. The switching circuit 3 separates a DCS transmission signal and a DCS reception signal from the DCS transmission/reception signal. The LC filter 4 allows only a frequency band of the EGSM transmission signal to pass, and prevents the EGSM reception signal from reaching the transmission circuit Tx (EGSM) for the low-frequency band. The SAW filter 5 allows only a frequency band of the EGSM reception signal to pass, and prevents the EGSM transmission signal from reaching the reception circuit Rx (EGSM) for the low-frequency band. The LC filter 6 allows only a frequency band of the DCS transmission signal to pass, and prevents the DCS reception signal from reaching the transmission circuit Tx (DCS) for the high-frequency band. The SAW filter 7 allows only a frequency band of the DCS reception signal to pass, and prevents the DCS transmission signal from reaching the reception circuit Rx (DCS) for the high-frequency band.

FIG. 2 is a circuit diagram of the diplexer 1. The diplexer 1 includes the first port P1A, the second port P1B, the third port P1C, lines Lt1 and Lt2, and capacitors Cc1, Cc2, Ct2, Ct1, and Cu1.

A parallel circuit defined by the line Lt1 and the capacitor Ct1 is connected between the first port P1A and the second port P1B of the diplexer 1. An end of the parallel circuit adjacent to the second port P1B is grounded via the capacitor Cu1. The line Lt1, the capacitor Ct1, and the capacitor Cu1 define a low-pass filter 101 which defines a low-frequency filter. The parallel circuit defined by the line Lt1 and the capacitor Ct1 defines a parallel resonant circuit 101A. The line Lt1 and the capacitor Cu1 define a series circuit 101B. The low-frequency circuit is connected downstream of the second port P1B.

The capacitors Cc1 and Cc2 connected in series are connected between the first port P1A and the third port P1C of the diplexer 1. A node between the capacitors Cc1 and Cc2 is grounded via the line Lt2 and the capacitor Ct2. The capacitors Cc1, Cc2, and Ct2 and the line Lt2 define a high-pass filter 102 which defines a high-frequency filter. A series circuit defined by the line Lt2 and the capacitor Ct2 defines a series resonant circuit 102A. The high-frequency circuit is connected downstream of the third port P1C.

An impedance of each element of the low-pass filter 101 is adjusted such that the DCS transmission/reception signal is attenuated and the EGSM transmission/reception signal is allowed to pass through. In particular, a resonant frequency of the parallel resonant circuit 101A is set such that the characteristic curve becomes steep at an attenuation pole at about 1.9 GHz which is a standard center frequency in the DCS system. Thus, the low-pass filter 101 is designed by adjusting the impedance (inductance value) of the line Lt1, the impedance (capacitance value) of the capacitor Ct1, and the impedance (capacitance value) of the capacitor Cu1.

An impedance of each element of the high-pass filter 102 is adjusted such that the EGSM transmission/reception signal is attenuated and the DCS transmission/reception signal is allowed to pass through. In particular, a resonant frequency of the series resonant circuit 102A is set such that an attenuation pole is located at about 900 MHz which is a standard center frequency in the EGSM system and a drop-off in the characteristic curve appears at about 900 MHz. Thus, the high-pass filter 102 is designed by adjusting the inductance value of the line Lt2 and the capacitance value of the capacitor Ct2.

In the SAW filter 5 used in the high-frequency component 10, impedance matching is not provided at frequencies outside its passband. Therefore, at frequencies outside the passband, signal reflection occurs in a connecting portion of the SAW filter 5 and new resonance occurs in the low-frequency filter. Specifically, resonance occurs at a resonant frequency corresponding to the impedance of three of the elements of the low-pass filter 101, that is, the line Lt1, the capacitor Ct1, and the capacitor Cu1.

If nothing is done, this resonance may adversely affect the transmission characteristics at high frequencies and cause an undesired attenuation pole to occur in the transmission characteristics at high frequencies. Therefore, in preferred embodiments of the present invention, an adjustment is performed such that an attenuation pole occurring in the transmission characteristics at high frequencies due to the new resonance is located at a frequency of a predetermined attenuation pole in the transmission characteristics at high frequencies, that is, at about a standard center frequency in the EGSM system.

Transmission characteristics between the first port P1A and the second port P1B of the diplexer will be described with reference to FIG. 3. FIG. 3 shows transmission characteristics in comparative examples and an example of a preferred embodiment of the present invention.

Figure 3A:
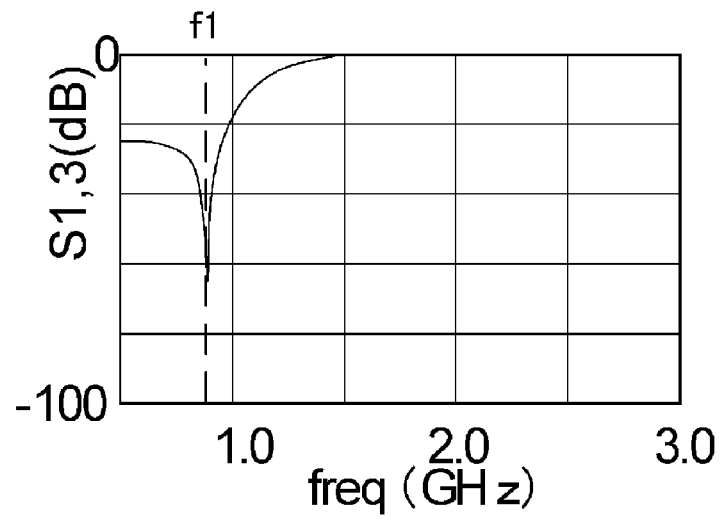
FIG. 3A to FIG. 3C are graphs showing transmission characteristics of high-frequency filters.

FIG. 3A shows a comparative example in which the SAW filter 5 for low frequencies is not provided and a node of the SAW filter 5 is terminated at about 50Ω, which is substantially equal to a circuit characteristic impedance. In the description below, the transmission characteristics shown in FIG. 3A will be treated as approximately ideal cutoff characteristics.

As shown in FIG. 3A, the high-pass filter 102 has an attenuation pole f1 located at about 900 MHz which is a standard center frequency in the low-frequency band. Frequencies greater than that of the attenuation pole f1 correspond to the passband of the high-pass filter 102. The attenuation pole f1 is set according to the resonant frequency of the series resonant circuit 102A in the high-pass filter 102.

Figure 3B:
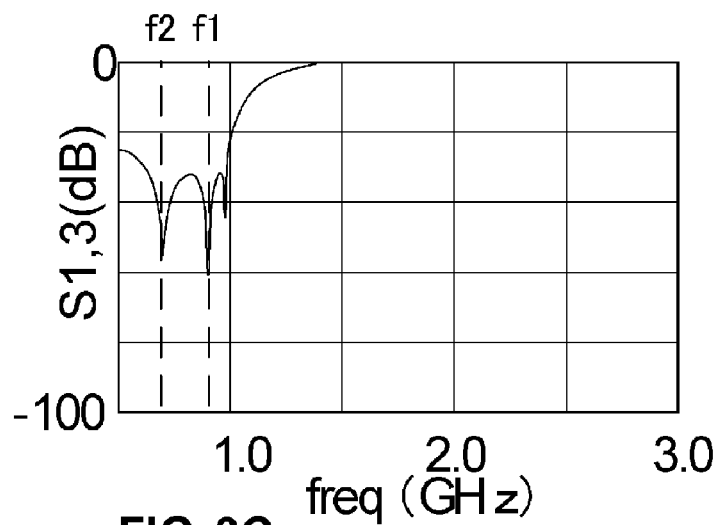

FIG. 3B shows a comparative example and is a graph showing deteriorated cutoff characteristics in which the configuration according to preferred embodiments of the present invention is not used. In this configuration, the SAW filter 5, in which a significant amount of impedance mismatching occurs at frequencies outside its passband, is provided in the low-frequency circuit.

In this case, the attenuation pole f1 is also located at about 900 MHz which is a standard center frequency in the low-frequency band. Then, since the low-frequency circuit is provided with the SAW filter 5 in which impedance matching is not achieved at frequencies outside its passband, signal reflection occurs in a connecting portion of the SAW filter 5. Thus, in the low-pass filter 101, new resonance of all of the elements of the low-pass filter 101 occurs.

The new resonance causes an undesired attenuation pole f2 to occur in the cutoff characteristics at high frequencies and deteriorates the attenuation characteristics. In the example shown in FIG. 3B, the undesired attenuation pole f2 occurs at a frequency of about 0.4 GHz.

Figure 3C:
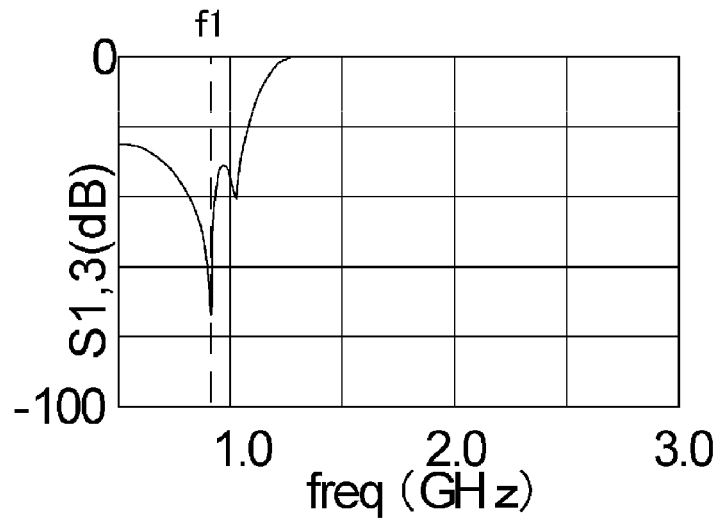

FIG. 3C is a comparative example and is a graph showing improved cutoff characteristics at high frequencies based in which the configuration according to preferred embodiments of the present invention is used. In this configuration, the SAW filter 5, in which impedance matching is not achieved at frequencies outside its passband, is provided in the low-frequency circuit and the SAW filter 5 is not terminated at about 50Ω at frequencies outside its passband. Here, the resonant frequency of all of the elements of the low-pass filter 101 is appropriately set.

In this case, the undesired attenuation pole f2 occurring in the cutoff characteristics at high frequencies due to the occurrence of a new resonance is set to be located at about 900 MHz and to substantially coincide with the predetermined attenuation pole f1 of the high-pass filter 102. Thus, an undesired attenuation pole occurring in the cutoff characteristics at high frequencies due to an impedance mismatch is removed.

Here, since a predetermined attenuation pole in the cutoff characteristics at high frequencies is set at a standard center frequency in the low-frequency band, the resonance of all of the elements of the low-pass filter 101 is set as described above. However, if a different predetermined attenuation pole is set in the cutoff characteristics at high frequencies, the undesired attenuation pole described above may be set to substantially coincide with the different predetermined attenuation pole.

If the resonant frequency of all of the elements of the low-pass filter 101 falls within the passband of the SAW filter 5, the characteristic impedance of the SAW filter in its passband is about 50Ω and the resonance of all of the elements of the low-pass filter 101 does not occur. In this situation, it is preferable to appropriately set the resonant frequency of all of the elements of the low-pass filter 101 to be shifted from the passband of the SAW filter 5.

Hereinafter, configurations of the switching circuits 2 and 3 and the LC filters 4 and 6 of the present preferred embodiment will be described.

Figure 4A:
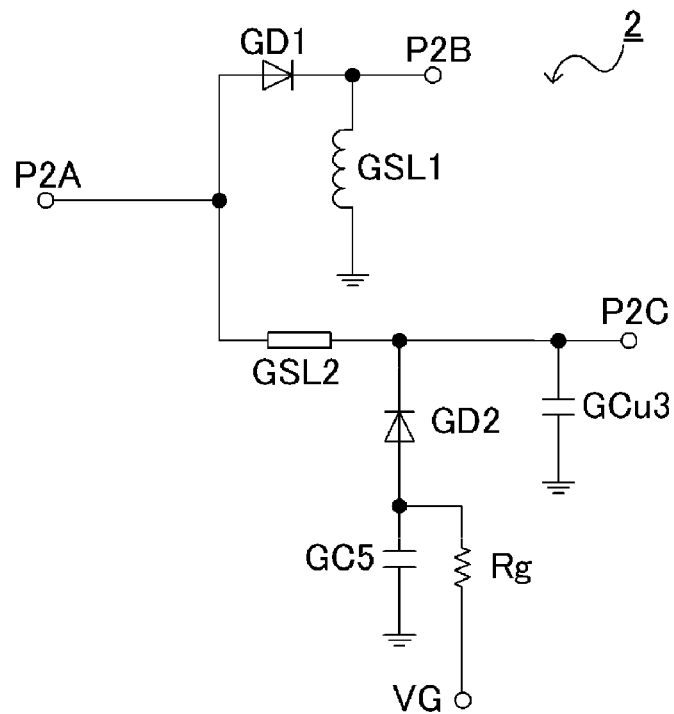
FIG. 4A and FIG. 4B are circuit diagrams illustrating switching circuits of a preferred embodiment of the present invention.

FIG. 4A is a circuit diagram of the switching circuit 2. The switching circuit 2 switches the low-frequency transmission/reception signal between the transmission signal and the reception signal.

The switching circuit 2 includes the first port P2A, the second port P2B, the third port P2C, a switching control terminal VG, diodes GD1 and GD2, an inductor GSL1, a line GSL2, capacitors GC5 and GCu3, and a resistor Rg.

The diode GD1 is connected between the first port P2A and the second port P2B such that the anode of the diode GD1 is adjacent to the first port P2A. An end of the diode GD1 adjacent to the second port P2B, that is, the cathode of the diode GD1 is grounded via the inductor GSL1, which is a choke coil.

The line GSL2 is connected between the first port P2A and the third port P2C. The cathode of the diode GD2 is connected to an end of the line GSL2 adjacent to the third port P2C. At the same time, the end of the line GSL2 adjacent to the third port P2C is grounded via the capacitor GCu3. The anode of the diode GD2 is grounded via the capacitor GC5. The switching control terminal VG is connected via the resistor Rg to a node between the anode of the diode GD2 and the capacitor GC5.

Figure 4B:
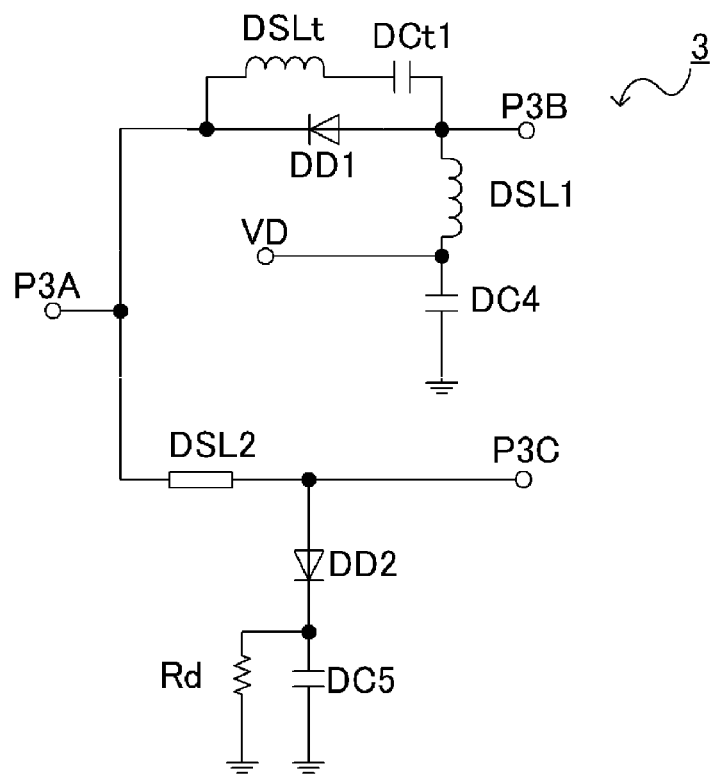

FIG. 4B is a circuit diagram of the switching circuit 3. The switching circuit 3 switches the high-frequency transmission/reception signal between the transmission signal and the reception signal.

The switching circuit 3 includes the first port P3A, the second port P3B, the third port P3C, a switching control terminal VD, diodes DD1 and DD2, inductors DSLt and DSL1, a line DSL2, capacitors DCt1, C, and DC5, and a resistor Rd.

The diode DD1 is connected between the first port P3A and the second port P3B such that the cathode of the diode DD1 is adjacent to the first port P3A. A series circuit defined by the inductor DSLt and the capacitor DCt1 is connected in parallel with the diode DD1. At the same time, an end of the diode DD1 adjacent to the second port P3B, that is, the anode of the diode DD1 is grounded via the inductor DSL1, which is a choke coil, and the capacitor C. The switching control terminal VD is connected to a node between the inductor DSL1 and the capacitor C.

The line DSL2 is connected between the first port P3A and the third port P3C. The anode of the diode DD2 is connected to an end of the line DSL2 adjacent to the third port P3C. The cathode of the diode DD2 is grounded via the capacitor DC5. A node between the cathode of the diode DD2 and the capacitor DC5 is grounded via the resistor Rd.

Figure 5A:
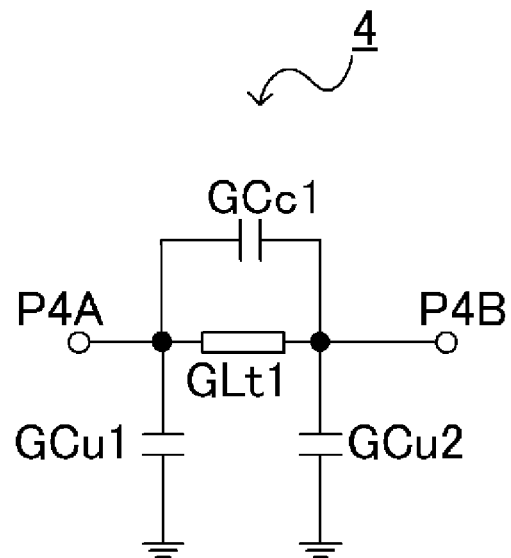
FIG. 5A and FIG. 5B are circuit diagrams illustrating LC filters of a preferred embodiment of the present invention.

FIG. 5A is a circuit diagram of the LC filter 4. The LC filter 4 attenuates the second and third harmonics of a low-frequency transmission signal.

The LC filter 4 includes the first port P4A, the second port P4B, a line GLt1, and capacitors GCc1, GCu1, and GCu2.

The line GLt1 is connected between the first port P4A and the second port P4B. The capacitor GCc1 is connected in parallel with the line GLt1. The capacitor GCu1 is connected between the first port P4A of the line GLt1 and the ground. The capacitor GCu2 is connected between the second port P4B of the line GLt1 and the ground.

Figure 5B:
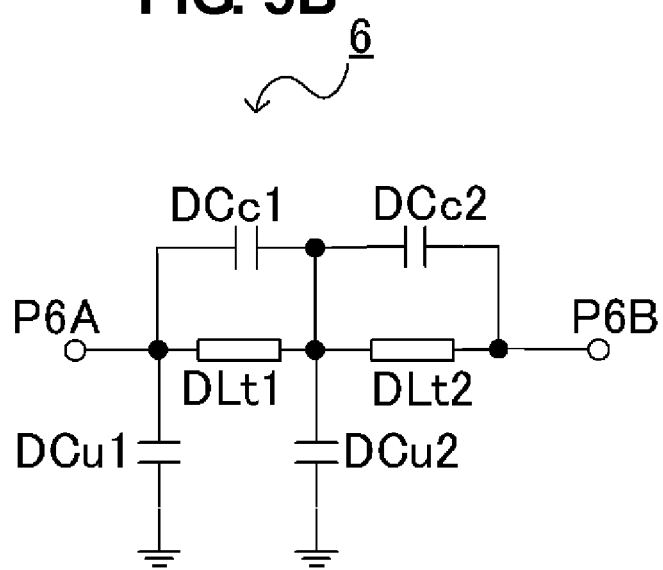

FIG. 5B is a circuit diagram of the LC filter 6. The LC filter 6 attenuates the second and third harmonics of a high-frequency transmission signal.

The LC filter 6 includes the first port P6A, the second port P6B, lines DLt1 and DLt2, and capacitors DCc1, DCu1, DCu2, and DCc2.

A parallel circuit defined by the line DLt1 and the capacitor DCc1 and a parallel circuit defined by the line DLt2 and the capacitor DCc2 are connected in series between the first port P6A and the second port P6B. The capacitor DCu1 is connected between the ground and an end of the parallel circuit defined by the line DLt1 and the capacitor DCc1, the end being adjacent to the first port P6A. The capacitor DCu2 is connected between the ground and the other end of the parallel circuit defined by the line DLt1 and the capacitor DCc1, the other end being adjacent to the second port P6B.

Circuit configurations of the SAW filter 5 and the SAW filter 7 will not be described here, as they may preferably be conventional configurations.

Thus, the high-frequency component of the present preferred embodiment includes the circuits described above. The high-frequency component of the present preferred embodiment defines a front end unit of a dual-band mobile communication apparatus that operates in the 900-MHz EGSM band and the 1.8-GHz DCS band. However, preferred embodiments of the present invention are applicable to any other combination of communication systems (e.g., 850-MHz EGSM and 1.9-GHz PCS).

Next, with reference to FIGS. 6 to 9, a description of a configuration in which the high-frequency component of the present preferred embodiment is mounted on a multilayer substrate including a plurality of stacked ceramic sheet layers.

FIGS. 6 to 8 are plan views illustrating conductive patterns on the respective layers. FIG. 6(1) illustrates the bottom layer and FIG. 8(21) illustrates the top layer. For convenience, the layers of the multilayer substrate are shown in three different drawings, FIGS. 6 to 8. Reference characters illustrated in FIGS. 6 to 8 correspond to reference characters shown in the circuit diagrams of FIG. 2, FIG. 4, and FIG. 5. Reference character GND in FIGS. 6 to 8 indicates a ground electrode.

In FIG. 6(1), reference character GND indicates a ground terminal. The other terminals illustrated in FIG. 6(1) correspond to the external connection terminals illustrated in FIG. 1. Here, the external connection terminals connected to, for example, transmission and reception circuits are indicated by reference characters indicating the circuits to which the external connection terminals are connected.

As illustrated in FIGS. 6 and 7, the line DSL2 is provided on the layers (8) to (13), the line Lt2 is provided on the layers (8) to (14), the line GSL2 is provided on the layers (8) to (13), and the strip line GLt1 is provided on the layers (8) to (13). Thus, since the strip lines having predetermined electrical lengths and used in the high-frequency switch are provided on substantially the same layers, the strip lines can be arranged in a limited area and with a limited number of layers. Therefore, even if an overall circuit size increases, it is possible to prevent an increase in the size of the chip.

Figure 9:
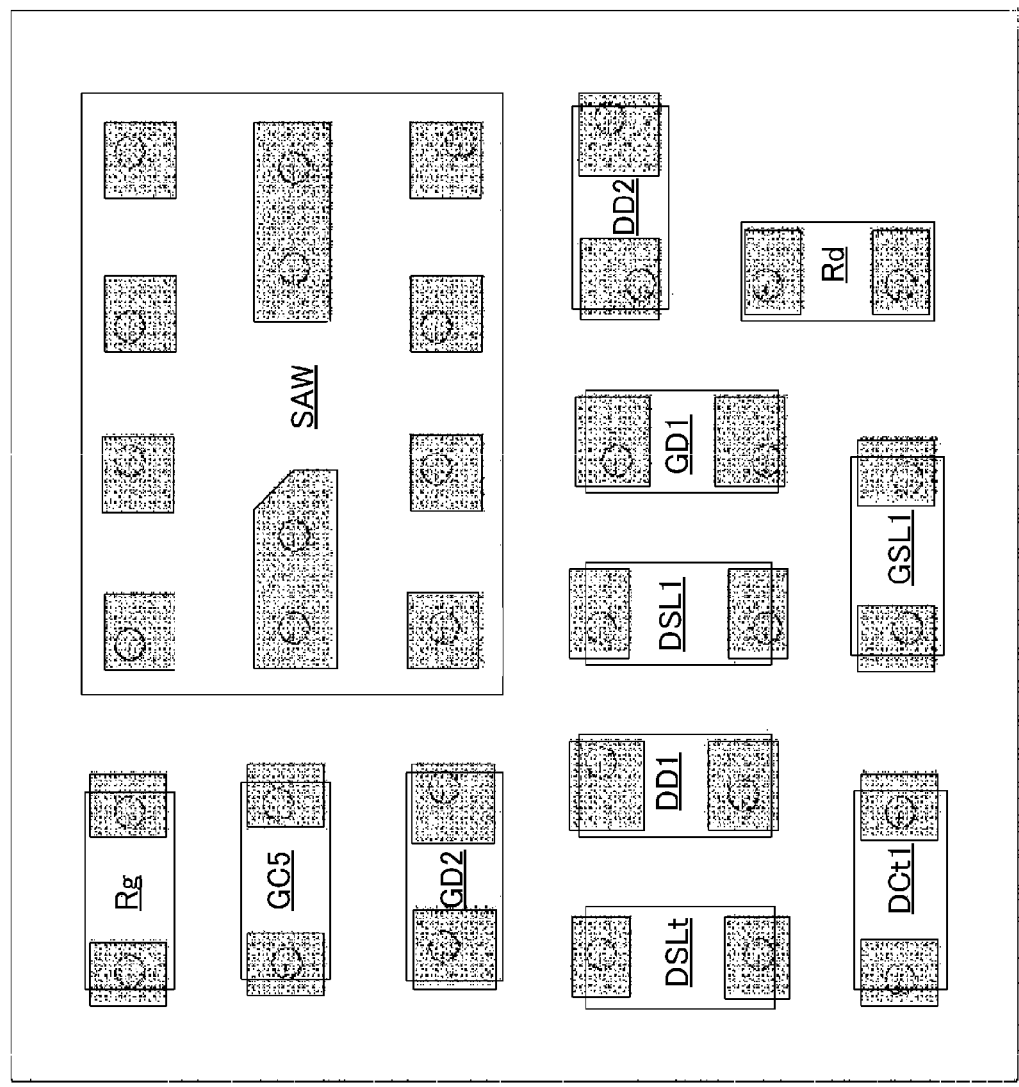
FIG. 9 also illustrates each layer of the high-frequency component of a preferred embodiment of the present invention.

FIG. 9 illustrates chip components mounted on the top surface of the laminated body. Here, a SAW filter is preferably a dual SAW filter including the SAW filter 5 for EGSM and the SAW filter 7 for DCS.

In the low-pass filter of the diplexer according to the present preferred embodiment, the line is preferably used as a reactance element that defines the series circuit and the parallel resonant circuit. However, the line may be replaced with a coil, a capacitor, or other suitable component, for example.

Next, a second preferred embodiment of the present invention will be described. A configuration of a high-frequency component according to the second preferred embodiment is substantially the same as that of the high-frequency component of the first preferred embodiment, but has different characteristics of the elements of the high-pass filter in the diplexer and different characteristics of the SAW filter in the circuit for the high-frequency band (DCS).

In the SAW filter 7 in the present preferred embodiment, impedance matching is not provided at frequencies outside the passband. Therefore, at frequencies outside the passband, signal reflection occurs in a connecting portion of the SAW filter 7 and new resonance occurs in the high-frequency filter. Specifically, series resonance occurs at a resonant frequency corresponding to the impedance of the line Lt2, the capacitor Ct2, and the capacitor Cc1 defining the series resonant circuit 102A in the high-pass filter 102. The line Lt2, the capacitor Ct2, and the capacitor Cc1 define a series resonant circuit.

If nothing is done, the series resonance of the line Lt2, the capacitor Ct2, and the capacitor Cc1 may adversely affect the transmission characteristics at low frequencies and may cause an undesired attenuation pole to occur in the transmission characteristics at low frequencies. Therefore, in the second preferred embodiment of the present invention, an adjustment is performed such that an attenuation pole occurring in the transmission characteristics at low frequencies due to the resonance of the line Lt2, the capacitor Ct2, and the capacitor Cc1 is located at approximately a second harmonic frequency of the standard center frequency in the EGSM system or approximately the standard center frequency in the DCS system.

Thus, when the new resonant frequency that occurs in the high-pass filter due to a mismatch in the SAW filter provided in the high-frequency (DCS) circuit is substantially equal to a frequency of a predetermined attenuation pole in the frequency characteristics at low frequencies, it is possible to prevent an undesired attenuation pole from occurring in transmission characteristics at low frequencies. Therefore, with a typical configuration, such as a configuration which does not require a phase adjusting circuit and a multistage high-pass filter, even when there is an impedance mismatch in the high-frequency circuit, it is possible to achieve desired transmission characteristics at low frequencies.

Preferred embodiments of the present invention are applicable to multiband high-frequency components, such as triple-band and quad-band high-frequency components, as well as to the dual-band high-frequency component, for example.

Figure 10:
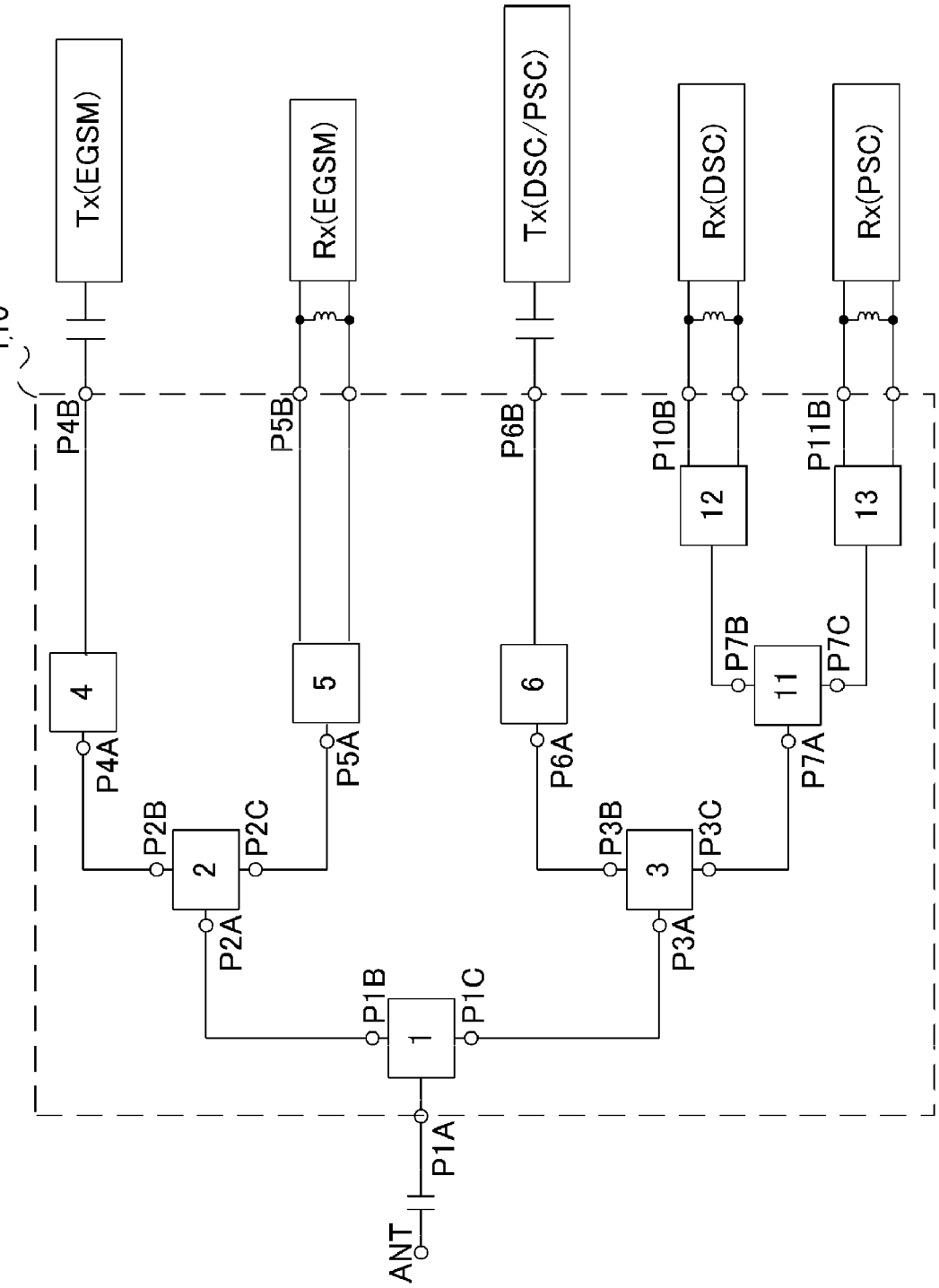
FIG. 10 is a block diagram of a dual-band high-frequency component according to another preferred embodiment of the present invention.
Figure 11:
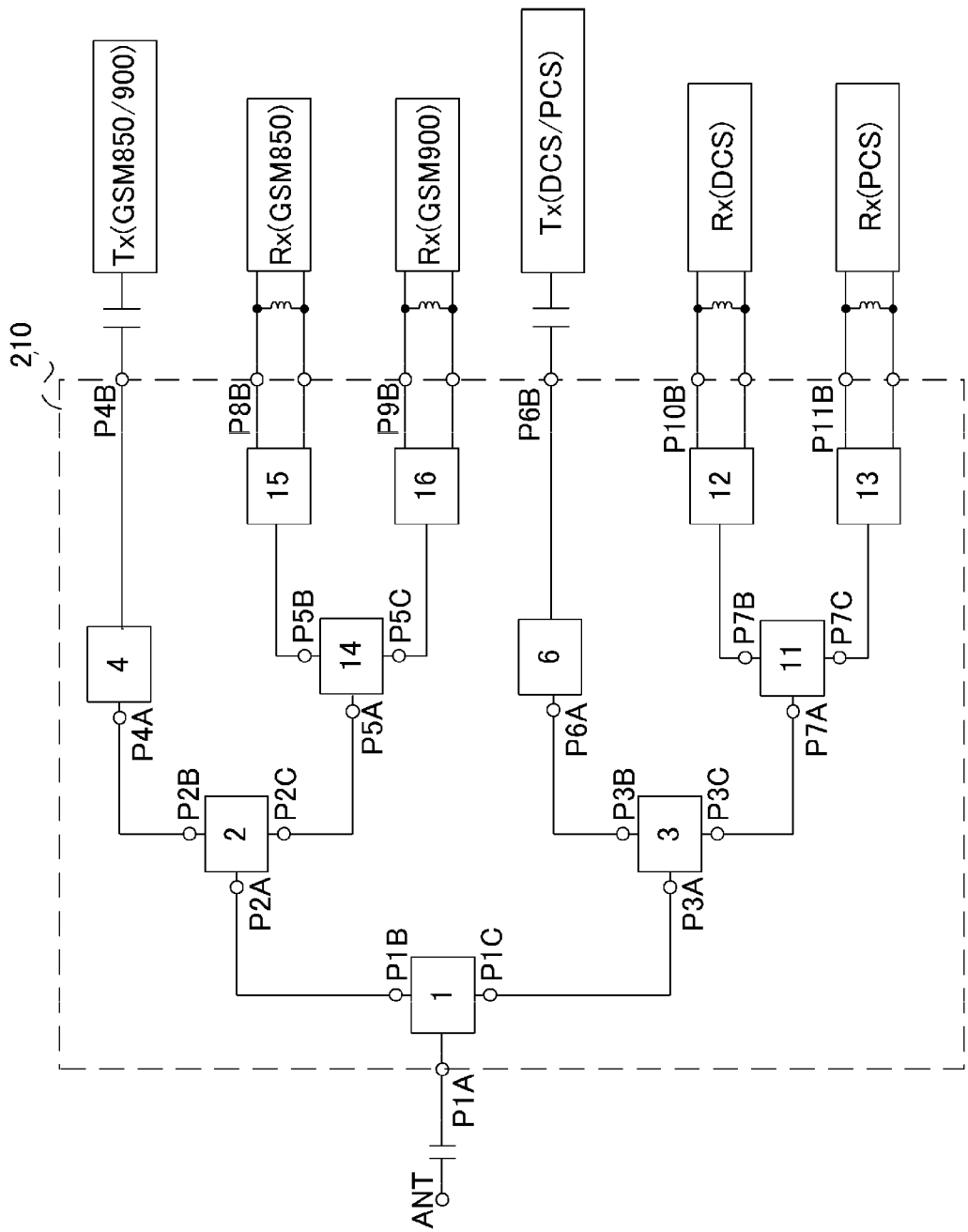
FIG. 11 is a block diagram of a quad-band high-frequency component according to another preferred embodiment of the present invention.

FIG. 10 is a block diagram of a dual-band high-frequency component. FIG. 11 is a block diagram of a quad-band high-frequency component.

A high-frequency component 110 illustrated in FIG. 10 has triple-band functionality for operation in the 900-MHz EGSM band, the 1.8-GHz DCS band, and the 1.9-GHz PCS band. A switching circuit 11 is further provided on the reception circuit side downstream of the switching circuit 3. The switching circuit 11 is connected via a SAW filter 12 to the reception circuit Rx (DCS) for the DCS system and is connected via a SAW filter 13 to a reception circuit Rx (PCS) for the PCS system. Similar to the first and second preferred embodiments of the present invention, by appropriately setting each element of the diplexer 1, even when an impedance mismatch occurs in the SAW filter 5, it is possible to prevent degradation in the transmission characteristics caused by undesired resonance at high frequencies.

A high-frequency component 210 illustrated in FIG. 11 has quad-band functionality for operation in the 850-MHz EGSM (GSM 850) band, the 900-MHz EGSM (GSM 900) band, the 1.8-GHz DCS band, and the 1.9-GHz PCS band. A switching circuit 14 is further provided on the reception circuit side downstream of the switching circuit 2. The switching circuit 14 is connected via a SAW filter 15 to a reception circuit Rx (GSM 850) for the GSM 850 system and is connected via a SAW filter 16 to a reception circuit Rx (GSM 900) for the GSM 900 system. By appropriately setting each element of the diplexer 1, even when an impedance mismatch occurs in the SAW filter 15 and the SAW filter 16, it is possible to prevent degradation in the transmission characteristics caused by undesired resonance at high frequencies.

As described above, preferred embodiments of the present invention can be used regardless of the number of communication systems and is also applicable to high-frequency components including a switchplexer having an antenna port, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A high-frequency component comprising:
a diplexer including a high-frequency filter and a low-frequency filter connected in parallel with an antenna port, wherein, among transmission/reception signals of a plurality of communication systems using different frequency bands, a high-frequency transmission/reception signal is allowed to pass and a low-frequency transmission/reception signal is attenuated by the high-frequency filter, and the low-frequency transmission/reception signal is allowed to pass and the high-frequency transmission/reception signal is attenuated by the low-frequency filter;

a high-frequency circuit cascade-connected to the high-frequency filter in the diplexer; and a low-frequency circuit cascade-connected to the low-frequency filter in the diplexer; wherein the low-frequency filter includes an inductor connected between the antenna port and the low-frequency circuit and is defined by a parallel circuit including the inductor and a first capacitor and a series circuit including the inductor and a second capacitor;

transmission characteristics of the low-frequency filter are set by the series circuit and the parallel circuit; and a resonant frequency of all elements of the low-frequency filter is set to be substantially equal to a frequency of a predetermined attenuation pole in frequency characteristics of the high-frequency filter.

2. The high-frequency component according to claim 1, wherein the resonant frequency of all of the elements of the low-frequency filter is set to be substantially equal to a trap frequency of the high-frequency transmission/reception signal in frequency characteristics of the high-frequency filter.

3. The high-frequency component according to claim 1, wherein at least one of the low-frequency circuit and the high-frequency circuit includes a mismatching element which causes an impedance mismatch to occur.

4. The high-frequency component according to claim 3, wherein the mismatching element is a filter.

5. The high-frequency component according to claim 1, wherein the low-frequency circuit includes a switching circuit arranged to direct the low-frequency transmission/reception signal tone of a transmission signal port and a reception signal port, and a SAW filter connected to the reception signal port of the switching circuit.

6. The high-frequency component according to claim 1, wherein the low-frequency circuit includes a first switching circuit arranged to direct the low-frequency transmission/reception signal to one of a transmission signal port and a reception signal port; a second switching circuit connected to the reception signal port of the first switching circuit and arranged to divide a low-frequency reception signal into reception signals in two frequency bands; and SAW filters connected downstream of the second switching circuit.

* * * * *